US009293198B2

(12) United States Patent
Krebs

(10) Patent No.: US 9,293,198 B2
(45) Date of Patent: Mar. 22, 2016

(54) PROGRAMMING OF GATED PHASE-CHANGE MEMORY CELLS

(71) Applicant: International Business Machines Corporation, Armonk, NY (US)

(72) Inventor: Daniel Krebs, Rueschlikon (CH)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 13/900,178

(22) Filed: May 22, 2013

(65) Prior Publication Data
US 2013/0322165 A1 Dec. 5, 2013

(30) Foreign Application Priority Data
May 31, 2012 (GB) .................................. 1209653.3

(51) Int. Cl.
G11C 11/00 (2006.01)
G11C 13/00 (2006.01)
G11C 11/56 (2006.01)
H01L 45/00 (2006.01)
H01L 27/24 (2006.01)

(52) U.S. Cl.
CPC ........ G11C 13/0004 (2013.01); G11C 11/5678 (2013.01); G11C 13/004 (2013.01); G11C 13/0009 (2013.01); G11C 13/0069 (2013.01); H01L 45/06 (2013.01); H01L 45/1206 (2013.01); H01L 45/1226 (2013.01); G11C 2013/0071 (2013.01); G11C 2013/0076 (2013.01); G11C 2213/53 (2013.01); H01L 27/2436 (2013.01)

(58) Field of Classification Search
USPC ........................................................ 365/163
See application file for complete search history.

(56) References Cited

U.S. PATENT DOCUMENTS

| 7,269,080 | B2 | 9/2007 | Bedeschi et al. |
| 7,656,710 | B1 | 2/2010 | Wong |
| 7,885,101 | B2 | 2/2011 | Bedeschi et al. |
| 8,085,583 | B2 | 12/2011 | Suh |
| 8,130,538 | B2 | 3/2012 | McElheny et al. |
| 8,301,977 | B2 | 10/2012 | Jagasivmani et al. |
| 2006/0145135 | A1 | 7/2006 | Huang et al. |
| 2007/0132049 | A1 | 6/2007 | Stipe |
| 2007/0177432 | A1* | 8/2007 | Spall .................. G11C 13/0004 365/189.05 |
| 2007/0236987 | A1* | 10/2007 | Cho ........................ G11C 8/10 365/163 |
| 2007/0248785 | A1* | 10/2007 | Nakai .................... G11B 7/006 428/64.4 |
| 2008/0149913 | A1 | 6/2008 | Tanaka et al. |

(Continued)

OTHER PUBLICATIONS

Cai et al., "Multi-Bit Storage Based on Chalcogenide Thin Film Transistor for High Density Nonvolatile Memory Application", Integrated Ferroelectrics, 110: 2009, pp. 34-42.

(Continued)

Primary Examiner — Huan Hoang
Assistant Examiner — Pablo Huerta
(74) Attorney, Agent, or Firm — Cantor Colburn LLP

(57) ABSTRACT

A method for programming gated phase-change memory cells, each with a gate, source and drain, having s≥2 programmable cell-states including an amorphous RESET state and at least one crystalline state includes applying a programming signal between the source and drain of a memory cell to program that cell to a desired cell-state; and when programming the cell from a crystalline state to the RESET state, applying a bias voltage to the gate of the cell to increase the cell resistance.

20 Claims, 4 Drawing Sheets

(56) References Cited

U.S. PATENT DOCUMENTS

| | | |
|---|---|---|
| 2009/0059651 A1 | 3/2009 | Aoki |
| 2009/0073741 A1 | 3/2009 | Liu |
| 2009/0080242 A1 | 3/2009 | Resta et al. |
| 2009/0296457 A1* | 12/2009 | Suh .................... G11C 13/0004 365/163 |
| 2010/0020593 A1 | 1/2010 | Suh |
| 2010/0103726 A1* | 4/2010 | Bae ........................ G11C 5/143 365/163 |
| 2010/0165712 A1* | 7/2010 | Bedeschi ............... G11C 11/56 365/163 |
| 2011/0069538 A1 | 3/2011 | Lam et al. |
| 2012/0051170 A1 | 3/2012 | Yoon et al. |
| 2012/0092941 A1* | 4/2012 | Porter ................ G11C 13/0004 365/189.15 |
| 2013/0040584 A1* | 2/2013 | Bedeschi ........... G11C 11/5678 455/90.2 |

OTHER PUBLICATIONS

Hosaka et al., "Prototype of Phase-Change Channel Transistor for Both Nonvolatile Memory and Current Control", IEEE Transactions on Electron Devices, vol. 54, No. 3, Mar. 2007, 15 pages.

Liao, et al., "Characterization of Ge2Sb2Te5 thin film transistor and its application in non-volatile memory", Microelectronics Journal 37 (2006); www.elsevier.com/locate/mejo; pp. 841-844.

UK Intellectual Property Office, Application No. GB1209652.5; Patents Act 1977: Search Report Under Section 17(5); Mailed Sep. 26. 2012, pp. 1-3.

UK Intellectual Property Office, Application No. GB1209653.3; Patents Act 1977: Search Report Under Section 17(5); Mailed Sep. 26. 2012, pp. 1-4.

Gong Yue-Feng, et al., "Programming Voltage Reduction in Phase Change Cells with Conventional Structure," IEEE, 2011, pp. 1-3.

* cited by examiner

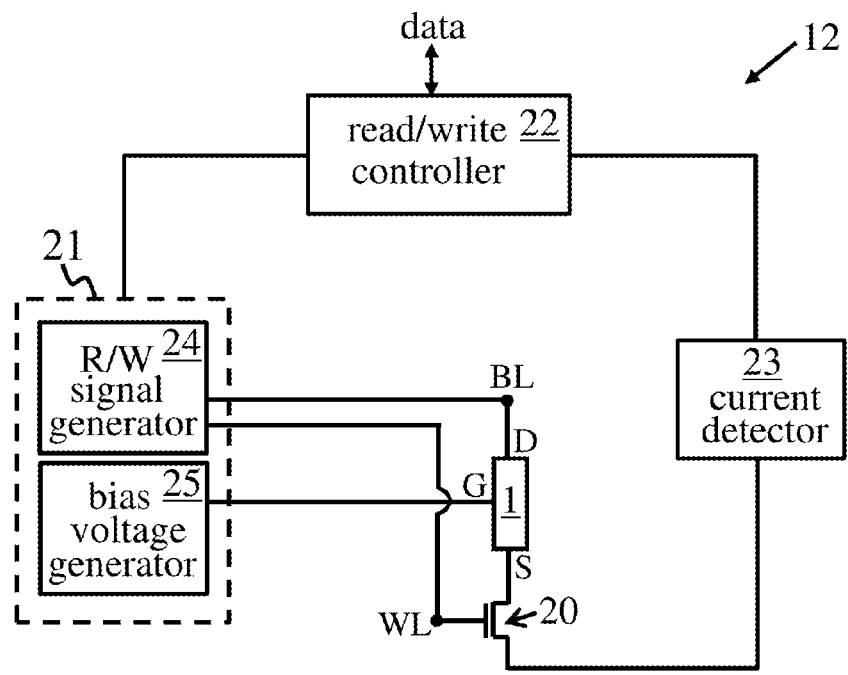
Figure 3
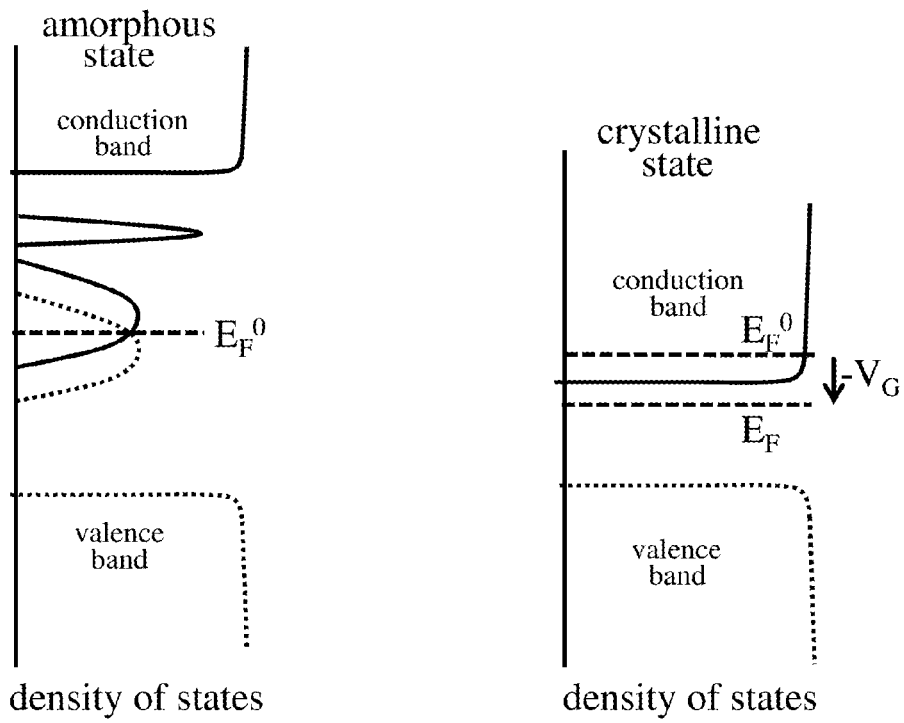
Figure 4A
Figure 4B

US 9,293,198 B2

PROGRAMMING OF GATED PHASE-CHANGE MEMORY CELLS

PRIORITY

This application claims priority to Great Britain Patent Application No. 1209653.3, filed May 31, 2012, and all the benefits accruing therefrom under 35 U.S.C. §119, the contents of which in its entirety are herein incorporated by reference.

BACKGROUND

This invention relates generally to programming of gated phase-change memory cells. Programming methods and apparatus are provided, together with read/write systems and memory devices employing the programming technique.

Phase change memory (PCM) is a non-volatile solid-state memory technology that exploits the reversible, thermally-assisted switching of certain chalcogenide compounds, such as GST, between states with different electrical resistance. The fundamental storage unit (the "cell") can be programmed to any one of $s \geq 2$ different states, or levels, which exhibit different resistance characteristics. The s programmable cell-states can be used to represent different data values, whereby data can be recorded in the cells. In single-level PCM devices, the cell can be set to one of $s=2$ states, a crystalline state and an amorphous "RESET" state. In the RESET state, the electrical resistance of the cell is high. When heated to a temperature above its crystallization point and then cooled, the chalcogenide material is transformed into its low-resistance crystalline state. If the cell is then heated to a high temperature, above the chalcogenide melting point, the chalcogenide material reverts to the amorphous RESET state on rapid cooling. In multilevel PCM devices, the cell can be set to $s>2$ different states permitting storage of more than one bit per cell. As well as the two states used for SLC operation, multilevel cells exploit partially-crystalline states in which the cell contains different volumes of the amorphous phase within the crystalline PCM material. Varying the size of the amorphous region produces a corresponding variation in cell resistance. The partially-crystalline states thus provide additional programmable states, with intervening resistance values, between the wholly-crystalline low-resistance state and the high-resistance RESET state.

To write data in PCM devices, cells are programmed to different cell-states by the application of current or voltage signals. Joule heating due to the programming signal heats the chalcogenide material to an appropriate temperature to induce the desired cell-state on cooling. Reading of PCM cells is performed using cell resistance as a metric for cell-state. Read measurements are usually performed by biasing the cell with a fixed read voltage and measuring the resulting current flowing through the cell. A sufficiently low read voltage is used for this resistance metric to ensure that application of the read voltage does not disturb the programmed cell-state. Cell-state detection can be performed by comparing the resistance metric for each cell with predetermined reference levels defining the s programmable cell-states. The larger the resistance difference between the lowest and highest resistance states, the more robust the read-detection process. Hence, the amorphous RESET state must have a very high resistance while the fully-crystalline state should have a very low resistance. However, programming via Joule heating requires a large current to pass through the cell. In particular, since power dissipation for a given current decreases with cell resistance, a particularly large cell current is needed to reset a cell from a low-resistance crystalline state to the amorphous RESET state.

Conventional PCM cells are two-terminal devices consisting of a layer of chalcogenide material between a pair of electrodes. To form an integrated memory array, cells arranged in rows and columns are connected in parallel between pairs of word- and bit-lines. An access device, typically an FET (field-effect transistor) whose gate is connected to the word-line, is connected in series with the PCM cell which is connected in turn to the cell bit-line. A particular cell is accessed for read/write operations by applying a word-line voltage to the gate of the associated FET. The programming/read signal is then applied via the cell bit-line.

More recently, gated PCM cells have been proposed. These cells have three terminals, a gate, source and drain, with the PCM material forming a channel between the source and drain. Gated PCM cells are discussed, for example, in: "Prototype of Phase-Change Channel Transistor for both Non-volatile Memory and Current Control", Hosaka et al., IEEE Transactions on Electron Devices, 2007, 54, 517-523; and "Multi-bit Storage based on Chalcogenide Thin Film Transistor for High Density Nonvolatile Memory Application", Yanfei Cai, et al., Integrated Ferroelectrics, 110: 34-42, 2009.

SUMMARY

In one embodiment, a method for programming gated phase-change memory cells, each with a gate, source and drain, having $s \geq 2$ programmable cell-states including an amorphous RESET state and at least one crystalline state includes applying a programming signal between the source and drain of a memory cell to program that cell to a desired cell-state; and when programming the cell from a crystalline state to the RESET state, applying a bias voltage to the gate of the cell to increase the cell resistance.

In another embodiment, an apparatus for programming gated phase-change memory cells, each with a gate, source and drain, having $s \geq 2$ programmable cell-states including an amorphous RESET state and at least one crystalline state, the apparatus including a signal generator configured to apply a programming signal between the source and drain of a memory cell to program the cell to a desired cell-state; a bias voltage generator configured to apply a bias voltage to the gate of a cell; and a controller configured to control the signal generator and bias voltage generator such that, when programming a cell from a crystalline state to the RESET state, the bias voltage generator applies a bias voltage to the gate of the cell to increase the cell resistance.

BRIEF DESCRIPTION OF THE SEVERAL VIEWS OF THE DRAWINGS

Exemplary embodiments of the invention will now be described, by way of example, with reference to the accompanying drawings in which:

FIG. 3 is a schematic block diagram of read/write apparatus of the memory device;

FIGS. 4A and 4B are energy band diagrams for amorphous and crystalline states of a PCM cell;

DETAILED DESCRIPTION

Figure 1:
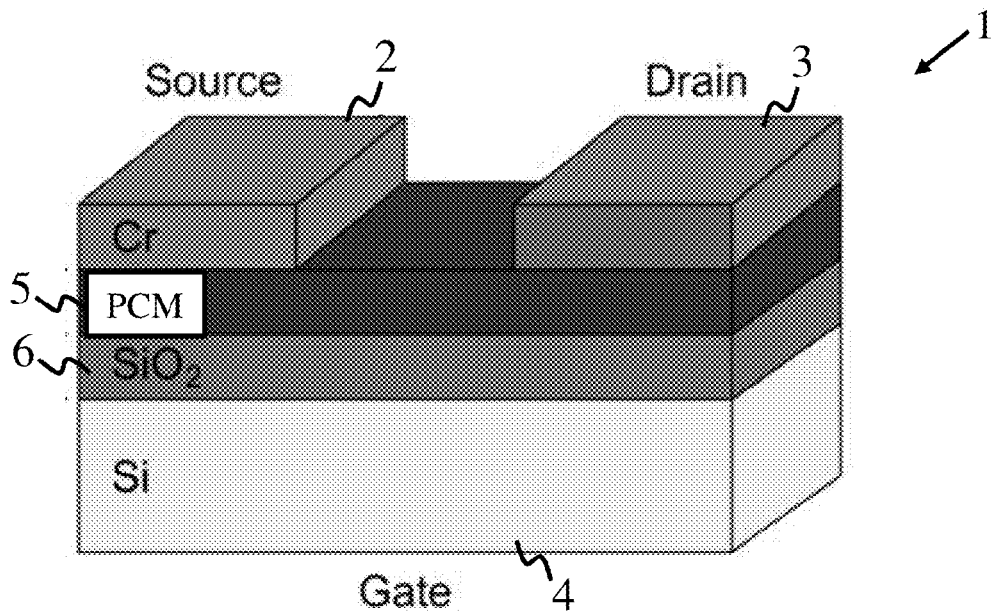
FIG. 1 is a schematic illustration of a gated PCM cell.

An embodiment of a first aspect of the present invention provides a method for programming gated phase-change memory cells, each with a gate, source and drain, having s≥2 programmable cell-states including an amorphous RESET state and at least one crystalline state. The method includes: applying a programming signal between the source and drain of a memory cell to program that cell to a desired cell-state; and when programming a cell from a crystalline state to the RESET state, applying a bias voltage to the gate of that cell to increase the cell resistance.

In methods embodying this invention, the resistance of a gated PCM cell in a crystalline state is increased on programming to the RESET state by application of an appropriate gate voltage to the cell. This improves current efficiency for the reset operation because power dissipation in the cell will be higher for a given current and hence a given programming signal, providing an effective RESET current reduction. As this effect is controlled by the gate voltage, power efficiency can be improved without reducing the resistance contrast between the amorphous and fully-crystalline states since the low-field resistance of the crystalline cell at zero gate bias is not affected. This elegantly simple technique thus offers increased power efficiency without affecting readback performance.

While a gate voltage could be applied to any cell to be reset to the amorphous state, for optimum power efficiency on programming it is desirable to apply the gate voltage on reset only when programming from a crystalline state, and not when the cell is already programmed to the RESET state. For this reason, exemplary embodiments include the steps of: reading a memory cell before programming to obtain an indication of cell-state; and, when programming a cell to the RESET state, applying the bias voltage only if a crystalline cell-state is indicated on reading. Such "read-before-write" functionality is commonly employed in any case, e.g. in known iterative WAV (write-and-verify) type programming.

The cell-resistance can be tuned by adjusting the gate bias. While any increase in resistance will improve power efficiency, the gate voltage level is selected to provide optimum results. In particular, the bias voltage level can set to increase the cell resistance to a value at or near a predetermined maximum value for the crystalline state. For example, the voltage level may be selected to give a cell resistance within a desired window of the maximum achievable by varying the gate bias.

Methods embodying the invention can be applied to both single-level and multilevel PCM cells. In the latter case, the above technique can be used to increase cell resistance when programming from any (wholly or partially) crystalline state to the RESET state. In some embodiments, zero bias voltage may be applied to the gate of a cell on programming that cell to a crystalline state. In other embodiments, on programming a cell to a crystalline state, a bias voltage for that state may be applied to the gate of the cell so as to program that state on application of the programming signal. This is discussed further below.

An embodiment of a second aspect of the invention provides a method for reading and writing data in gated phase-change memory cells, each with a gate, source and drain, having s≥2 programmable cell-states including an amorphous RESET state and at least one crystalline state. The method comprises: writing data in memory cells by programming the cells using a method according to the first aspect of the invention; and reading data in memory cells by applying a read signal between the source and drain of each cell with zero bias voltage applied to the gate of that cell, and making a read measurement to obtain an indication of cell-state. In this way, cells can be read using the conventional low-field resistance metric unaffected by any gate bias.

An embodiment of a third aspect of the invention provides apparatus for programming gated phase-change memory cells, each with a gate, source and drain, having s≥2 programmable cell-states including an amorphous RESET state and at least one crystalline state. The apparatus includes: a signal generator for applying a programming signal between the source and drain of a memory cell to program that cell to a desired cell-state; a bias voltage generator for applying a bias voltage to the gate of a cell; and a controller for controlling the signal generator and bias voltage generator such that, when programming a cell from a crystalline state to the RESET state, the bias voltage generator applies a bias voltage to the gate of that cell to increase the cell resistance.

An embodiment of a fourth aspect of the invention provides read/write apparatus for reading and writing data in gated phase-change memory cells, each with a gate, source and drain, having s≥2 programmable cell-states including an amorphous RESET state and at least one crystalline state. The read/write apparatus includes: apparatus according to the third aspect of the invention for programming memory cells to write data in the cells, wherein the signal generator is adapted to apply a read signal between the source and drain of a memory cell for reading that cell, and wherein the controller is adapted to control the signal generator for reading and writing of cells; and a measurement circuit for making a read measurement on application of the read signal to a cell to obtain an indication of cell-state.

An embodiment of a fifth aspect of the invention provides a memory device including: memory comprising a plurality of gated phase-change memory cells, each with a gate, source and drain, having s≥2 programmable cell-states including an amorphous RESET state and at least one crystalline state; and read/write apparatus according to the fourth aspect of the invention for reading and writing data in the memory cells.

In general, where features are described herein with reference to an embodiment of one aspect of the invention, corresponding features may be provided in embodiments of another aspect of the invention.

FIG. 1 illustrates the basic structure of an exemplary gated PCM cell. The cell 1 has chromium source and drain electrodes 2, 3 and a silicon gate electrode 4. A layer of phase-change material provides the channel 5 between the source 2 and drain 3. A gate oxide layer 6 of silicon dioxide lies between the gate 4 and PCM channel 5. While a particular example is illustrated here, other materials and layers may be employed in the gated cell 1. In any case, by application of suitable programming signals between the source 2 and drain 3, the PCM material of channel 5 can be caused to switch between amorphous and crystalline states as described earlier, permitting storage of information in the cell.

Figure 2:
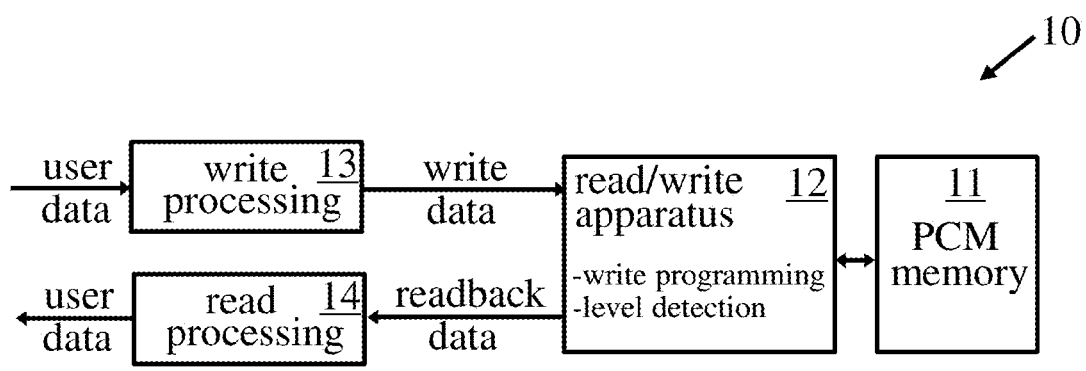
FIG. 2 is a schematic block diagram of a memory device embodying the invention.

FIG. 2 is a simplified schematic of a phase-change memory device embodying the invention. The device 10 includes phase-change memory 11 for storing data in one or more integrated arrays of gated PCM cells 1. In this example, the cells 1 are connected in parallel in a conventional array structure between pairs of word- and bit-lines. Reading and writing of data to memory 11 is performed by read/write apparatus 12. Apparatus 12 comprises circuitry for programming PCM cells during data write operations and for making read measurements for detecting cell-state (level detection) during read operations. During these operations, the read/write apparatus 12 can address individual PCM cells by applying appropriate control signals to the array of word and bit lines in memory ensemble 2. This process is performed in generally known manner except as detailed later below. As indicated by block 13 in the figure, user data input to device 10 is typically subjected to some form of write-processing, such as coding for error-correction purposes, before being supplied as write data to apparatus 12. Similarly, readback data output by apparatus 12 is generally processed by a read-processing module 14, e.g., for codeword detection and error correction, to recover the original input user data.

A write operation in device 1 involves programming a PCM cell into one of its s programmable cell-states. A read operation involves detecting which of these s states, or levels, the cell is set to. The structure and operation of read/write apparatus 12 is described in more detail below. For simplicity, operation will be described for PCM cells 1 having s=2 programmable states, an amorphous RESET state, which has high resistance and is used to represent binary "0", and a low-resistance crystalline state which is used to represent binary "1".

FIG. 3 is a block diagram showing the main components of read/write apparatus 12. The apparatus is shown connected via a bit-line BL and word-line WL to a particular PCM cell 1, with an associated access device 20, for a read/write operation on the cell. The access device 20 in this example is an FET whose gate is connected to the word-line WL. FET 20 is connected to source S of cell 1. The drain D of cell 1 is connected to the bit-line BL. The apparatus 12 includes a signal generator, indicated generally at 21, a read/write controller 22, and a read measurement circuit implemented here by current detector 23. Signal generator 21 comprises a read/write (R/W) signal generator 24 and a bias voltage generator 25. Bias voltage generator 25 is connected to the gate G of cell 1 for applying a bias voltage during certain write operations as described in detail below. Read/write signal generator 24 generates the control signals which are supplied via the cell bit- and word-lines to perform read/write operations on the cell. In particular, the signal generator 24 accesses the cell 1 for a read/write operation by applying a control voltage to the gate of FET 20 via the word-line WL. In a write operation, a programming signal is applied between source and drain of cell 1 by application of an appropriate voltage pulse via the bit-line BL. The height of the programming pulse is set so as to program the cell to the desired cell-state. In a read operation, a read signal is similarly applied to cell 1 by application of a low-voltage read pulse at the bit-line BL. The current detector 23 is connected to cell 1 during a read operation to measure the resulting current flowing through the cell. The measured cell-current $I_{read}$ is supplied to controller 22. Controller 22 controls operation of apparatus 12 generally, incorporating functionality for implementing the cell-programming method to be described and performing level detection based on read measurements $I_{read}$. Signal generator 21 and current detector 23 can be implemented in any desired manner, using hard-wired logic circuits, so as to perform the functions described. The functionality of controller 22 could be implemented in general in hardware or software or a combination thereof. Suitable implementations will be readily apparent to those skilled in the art from the description herein.

To program cell 1 in a data write operation, the apparatus 12 functions as follows. Read/write controller 22 first controls the apparatus to perform a read measurement on the cell. Hence, signal generator 24 applies a control voltage to the word-line to access the cell 1, and applies the low-voltage read signal at the cell bit-line. Zero bias voltage is applied by bias voltage generator 25 to the gate G of the cell for the read operation. The resulting cell current $I_{read}$ measured by current detector 23 is supplied to controller 22. The read measurement $I_{read}$ depends on cell resistance and thus provides a direct indication of the current state of the cell. The subsequent write operation depends on the result of this preliminary read measurement, and the state to which the cell is to be programmed, as follows.

If the cell is to be programmed to the amorphous RESET state, then operation differs depending on whether the preliminary read measurement indicates that the current cell-state is amorphous or crystalline. Assuming first that the current cell-state is amorphous, the programming operation is performed, under control of read/write controller 22, with zero bias voltage applied to the gate G of the cell by bias voltage generator 25. Hence, the appropriate programming voltage is applied by signal generator 24 to the bit-line of the cell so as to program the cell to the required RESET state. (Note that, although the preliminary read measurement already indicated an amorphous cell-state in this scenario, resistance levels of programmed states can drift with time so that this "re-programming" of the RESET state may be desirable to restore resistance levels. Reprogramming may also be required for particular coding schemes which require whole blocks of cells to be written, and hence over-written, at certain times).

Assuming next that a crystalline cell-state was indicated by the preliminary read operation, then the cell must be reset from the crystalline to the amorphous state. In this case, under control of read/write controller 22, the signal generator applies the appropriate reset programming voltage to the cell bit-line, and a bias voltage is applied to the gate G of the cell by bias voltage generator 25. The effect of this bias voltage is to increase the resistance of the cell compared to the cell-resistance at zero gate bias. More particularly, the bias voltage level is set so as to increase the cell resistance to within a desired window of a predetermined maximum resistance value for the crystalline state. The way in which the bias voltage polarity and level is selected here will be explained in detail below. The more resistive crystalline on-state obtained by application of the gate voltage results in increased power dissipation in the cell due to the applied programming signal. Thus, the required RESET current, and hence programming voltage for the reset operation, can be reduced, with a consequent improvement in power efficiency.

If the cell is to be programmed to the crystalline state in the write operation, then operation is independent of the preliminary read measurement. Controller 22 controls signal generator 21 such that the appropriate programming signal is applied to the cell bit-line. In this particular embodiment, zero gate bias applied to the gate of the cell for this programming operation. An alternative embodiment will be described below.

It will be seen from the foregoing that, when programming a cell 1 in memory device 10, the bias voltage generator 25 applies a gate bias, increasing cell resistance, only when programming from the crystalline state to the amorphous RESET state. Zero gate bias is applied for the read operation on a cell (which is performed in the same way for data readback and read-before-write operation on programming). This leads to highly efficient operation, with significant power saving due to the effective RESET current reduction. Moreover, the low-voltage resistance of the ungated cell is unaffected by this technique, whereby the large resistance contrast between crystalline and amorphous states is maintained for readback purposes.

The appropriate polarity and optimum level of the gate voltage applied for the reset operation depends on the design of the PCM cell. In particular, the optimum gate voltage depends on its effect on the Fermi level of the PCM material in question. This can be understood from consideration of FIGS. 4A to 6B. FIGS. 4A and 4B are schematic energy band diagrams for an exemplary PCM material in the amorphous state (FIG. 4A) and the crystalline state (FIG. 4B). The conduction band is shown at the top, and the valence band at the bottom, of these figures. Some arbitrary energy states are indicated in the band gap for the amorphous state, where the dotted line corresponds to hole-states and the solid lines to electron-states. In the amorphous state for this PCM cell, the Fermi level EF0 at zero gate bias is approximately mid-way between the conduction and valence bands, indicating a high cell resistance. In the crystalline state at zero gate bias, the Fermi level EF0 is in the conduction band, indicating a high conductivity due to electrons and hence a low cell resistance. If a negative gate bias voltage $-V_G$ is applied in this state, the Fermi level is moved towards the valence band due to induced holes, resulting in increased cell resistance. As $V_G$ is increased in magnitude with negative polarity, the Fermi level can be moved out of the conduction band as indicated at EF.

Figure 5B:
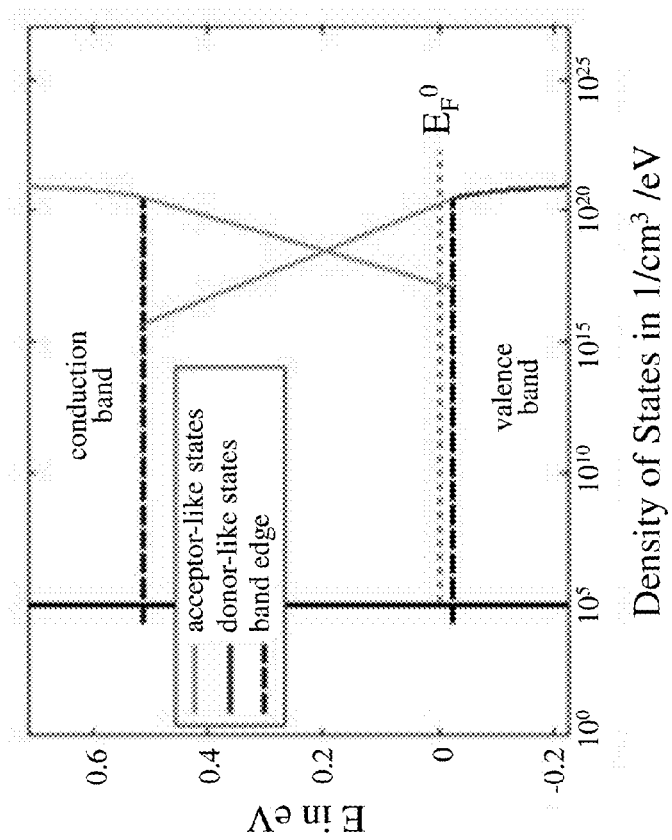
FIGS. 5A and 5B show energy band diagrams for amorphous and crystalline states of a different PCM cell.
Figure 5A:
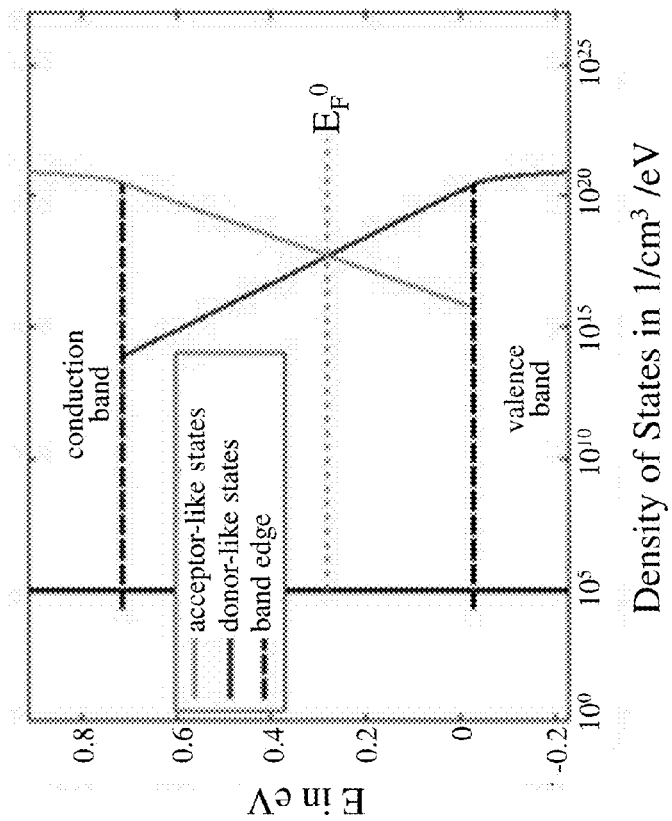

FIGS. 5A and 5B illustrate more realistic energy band diagrams based on simulations for a cell with different PCM material. The band edges are indicated by dashed lines in these figures, with each band having a tail portion in the band gap due to either acceptor-like states or donor-like states as indicated. Again, for the amorphous cell-state the Fermi level EF0 at zero gate bias is roughly midway between the conduction and valence bands. In this example, however, the Fermi level EF0 in the crystalline state at zero gate bias lies just above the valence band. Hence, application of a positive gate voltage in this state will cause the Fermi level to move up towards the conduction band due to induced electrons, resulting in decreased conductivity due to holes and an overall increase in cell resistance.

Figure 6B:
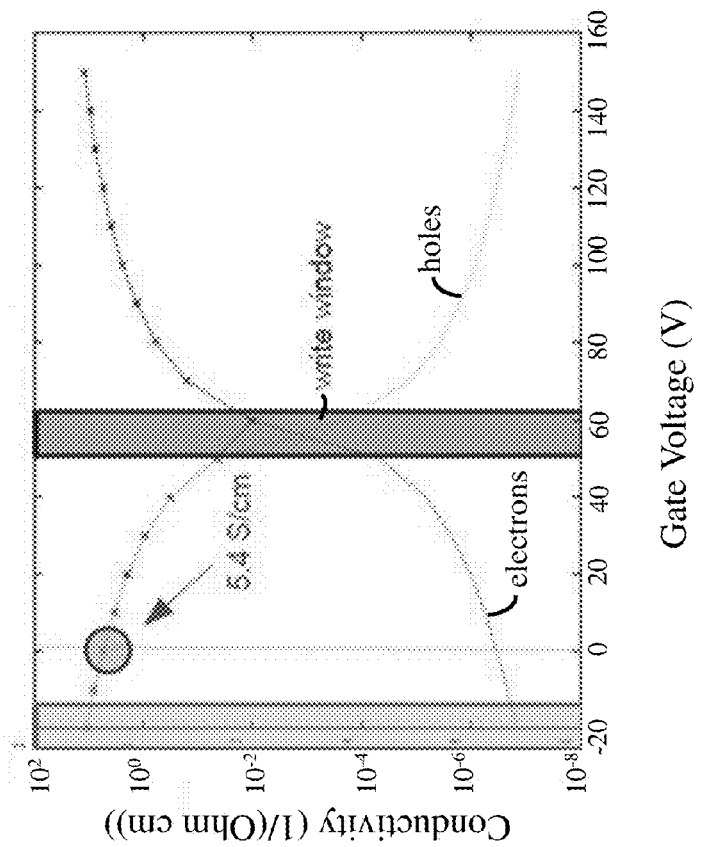
FIGS. 6A and 6B indicate variation of conductivity with gate voltage for the cell-states of FIGS. 5A and 5B.
Figure 6A:
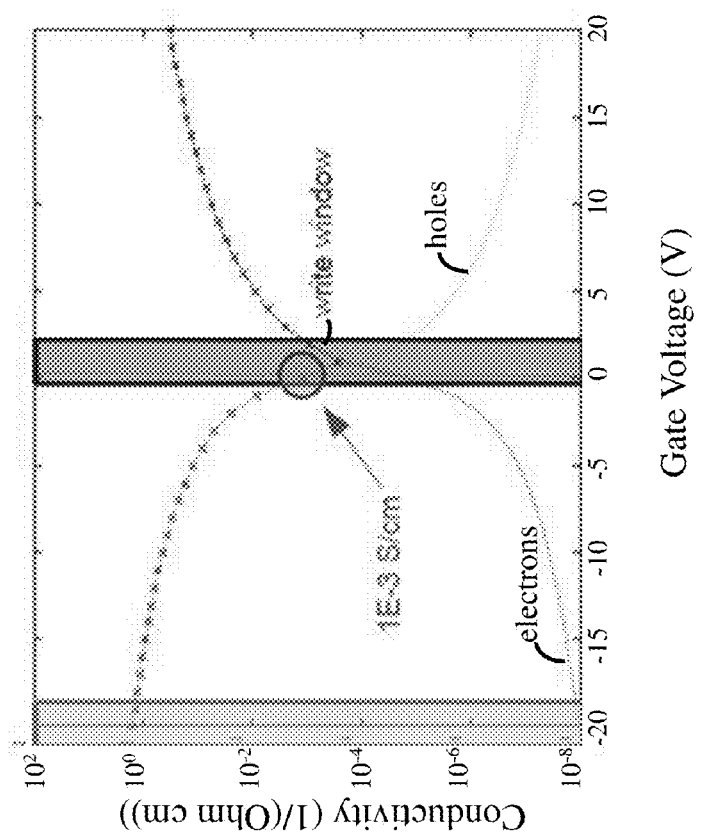

The overall effect of gate voltage $V_G$ on conductivity for the two states of FIGS. 5A and 5B is illustrated in FIGS. 6A and 6B respectively. In each figure, the trace which rises with gate voltage indicates conductivity due to electrons, and the trace which falls with gate voltage indicates conductivity due to holes. The sections marked with crosses indicate the dominant charge carrier. The point at which the hole and electron traces cross in each figure indicates the minimum overall conductivity, and hence maximum resistance, achievable by varying gate voltage in the corresponding cell-state. The vertical band labeled "write window" thus defines a range of gate voltages giving a cell resistance at or near the maximum for each state. In each figure, the circle marks the conductivity of the associated cell-state at zero gate bias. Note that, in the amorphous state, the zero-bias conductivity ($1E^{-3}$ siemens/cm) is already within the write window, indicating a cell resistance close to the maximum. In the crystalline state, however, conductivity at zero gate bias is high and primarily due to holes because of proximity of the Fermi level to the valence band as shown in FIG. 5B. The zero-bias conductivity (5.4 siemens/cm) in this state is therefore well outside the write window, resulting in a cell resistance much lower than the maximum. It can be seen, however, that if a positive gate voltage of about 50-60V is applied in this state, the conductivity can be moved into the write window in FIG. 6B, giving a cell resistance at or near the maximum as desired. (Note that the value of the gate voltage required here results from the particular materials and geometry used in the simulation. This value can be lowered by optimizing the gate stack as will be readily apparent to those skilled in the art).

It will be appreciated from the above that the resistance of the crystalline state can effectively be tuned by the gate bias. In general, if the Fermi level for the cell in the crystalline state is in or near the conduction band, the bias voltage polarity can be set to move the Fermi level towards the valence band. If the Fermi level in the crystalline state is in or near the valence band, the bias voltage polarity can be set to move the Fermi level towards the conduction band. By selecting a bias voltage level within the write window as described above, an optimum resistance and hence reset current can be achieved for programming a given cell type to the RESET state. In effect, therefore, the gate of the PCM cell is used as an additional knob for tuning the reset current to improve power efficiency.

While an exemplary embodiment has been described above, many changes and modifications can of course be envisaged. For example, while operation has been described for cells having s=2 programmable states for simplicity, the technique can be readily applied to multilevel cells. The s>2 programmable cell-states for multilevel operation may be defined in terms of predetermined reference values, or ranges of values, of the cell-state metric $I_{read}$ output by the read measurement operation. In a data read operation, the programmed state of a cell can be detected by comparing the metric Tread obtained from read measurement with the predetermined reference values for the cell levels. A gate voltage can then be applied to increase cell resistance as described above when programming from any (wholly or partially) crystalline state to the amorphous RESET state. Multilevel programming may be performed in generally known manner via an iterative WAV operation using a sequence of programming pulses. Here, read measurement is performed after each pulse in the sequence, and the amplitude of the next pulse is adjusted based on the metric output by the read measurement, until the desired programmed cell-state is achieved.

In the embodiment described above, zero bias voltage is applied to the gate of an addressed cell when programming to a crystalline state. In this case, a desired (wholly or partially) crystalline cell-state can be achieved by varying the programming pulse output by signal generator 24 in order to vary the resulting cell current. In other embodiments, the cell current for programming different states could be varied by varying the gate voltage to the cell. In this case, signal generator 24 could apply the same programming pulse for programming any crystalline state, and the desired cell-state can be achieved on application of the programming signal by applying a particular bias voltage for that state to the gate of the cell. The bias voltage for a given state may be predetermined for that state or may be determined based on a previous read measurement, e.g., during iterative programming as discussed above.

The memory 11 in the above embodiment has a conventional array structure in which access devices are provided for respective memory cells as described. The programming technique can be applied in other types of memory array. A particular example is described in our co-pending UK patent application filed concurrently herewith under Applicant's file reference CH9-2012-0018-GB1, the relevant contents of which are incorporated herein by reference in their entirety. That application describes a series arrangement of gated PCM cells in which, though each cell still has a source, gate and drain for use in read/write operations, the source and drain are common to all cells in the series so that a single source and drain are shared by every cell.

Voltage-mode programming and read operation is employed above whereby the programming/read signal is applied between the source and drain as a predetermined voltage, and the resulting cell current is measured for a read operation. Current-mode programming/read operation may alternatively be used, whereby a predetermined current pulse is applied for programming/read operations and the resulting voltage dropped across the cell is detected for the read measurement.

It will be appreciated that many other changes and modifications can be made to the embodiments described without departing from the scope of the invention.

The invention claimed is:

1. A method for programming gated phase-change memory cells, each with a gate, source and drain, having s≥2 programmable cell-states including an amorphous RESET state and at least one crystalline state, the method comprising:
reading a memory cell to be programmed, before programming, to obtain an indication of cell-state;
applying a programming signal between the source and drain of the memory cell to program the cell to a desired cell-state; and
only when programming the cell from a crystalline state to the RESET state, as determined by indicating the crystalline state from the reading of the cell, applying a bias voltage to the gate of the cell to increase the cell resistance; and
reprogramming the cell in the amorphous RESET state to the RESET state, as determined by indicating the amorphous RESET state from the reading of the cell, wherein the bias voltage is not applied to the gate of the cell at any time during the reprogramming, and wherein the reprogramming includes applying the programming signal between the source and drain of the memory cell to reprogram the cell to the RESET state while there is no voltage applied to the gate of the cell.

2. The method of claim 1, wherein the bias voltage level is set to increase the cell resistance to a value at or near a predetermined maximum value for the crystalline state.

3. The method of claim 1, wherein the Fermi level for a cell in a crystalline state is in or near the conduction band, and wherein the bias voltage polarity is set to move the Fermi level towards the valence band on applying the bias voltage.

4. The method of claim 1, wherein the Fermi level for a cell in a crystalline state is in or near the valence band, and wherein the bias voltage polarity is set to move the Fermi level towards the conduction band on applying the bias voltage.

5. The method of claim 1, wherein, on programming the cell to a crystalline state, applying zero bias voltage to the gate of that cell.

6. The method of claim 1, further comprising on programming a cell to a crystalline state, applying a bias voltage for the crystalline state to the gate of the cell to program the crystalline state on application of the programming signal.

7. The method of claim 1, wherein each memory cell is connected to a respective access device for controlling access to the cell for programming, the method including accessing a memory cell via the access device when applying a programming signal to program the cell.

8. The method of claim 1, wherein s=2.

9. The method of claim 1, wherein s>2.

10. The method of claim 1, wherein the reading the memory cell further comprises:
applying a read signal between the source and drain of each cell with zero bias voltage applied to the gate of the cell, and making a read measurement to obtain an indication of cell-state.

11. An apparatus for programming gated phase-change memory cells, each with a gate, source and drain, having s≥2 programmable cell-states including an amorphous RESET state and at least one crystalline state, the apparatus comprising:
a signal generator configured to apply a programming signal between the source and drain of a memory cell to program the cell to a desired cell-state;
the signal generator further configured to apply a read signal between the source and drain of each cell to facilitate making a read measurement to obtain an indication of cell-state;
a current detector configured to measure cell current to obtain the cell-state;
a bias voltage generator configured to apply a bias voltage to the gate of a cell; and
a controller configured to control the signal generator and bias voltage generator such that, when programming a cell from a crystalline state to the RESET state, the bias voltage generator applies a bias voltage to the gate of the cell to increase the cell resistance, only when the read measurement has indicated that the cell is in the crystalline state prior to the programming, and when reprogramming the cell in the amorphous RESET state to the RESET state, as determined by indicating the amorphous RESET state from the reading of the cell, the bias voltage generator does not apply a bias voltage to the gate of the cell at any time during the reprogramming, and wherein the reprogramming includes applying the programming signal between the source and drain of the memory cell to reprogram the cell to the RESET state while there is no voltage applied to the gate of the cell.

12. The apparatus of claim 11, wherein the bias voltage level is set to increase the cell resistance to a value at or near a predetermined maximum value for the crystalline state.

13. The apparatus of claim 11, wherein the Fermi level for a cell in a crystalline state is in or near the conduction band, and wherein the bias voltage polarity is set to move the Fermi level towards the valence band on applying the bias voltage.

14. The apparatus of claim 11, wherein the Fermi level for a cell in a crystalline state is in or near the valence band, and wherein the bias voltage polarity is set to move the Fermi level towards the conduction band on applying the bias voltage.

15. The apparatus of claim 11, wherein the controller is adapted to control the signal generator and bias voltage generator such that, when programming a cell to a crystalline state, zero bias voltage is applied to the gate of the cell.

16. The apparatus of claim 11, wherein the controller is adapted to control the signal generator and bias voltage generator such that, when programming a cell to a crystalline state, a bias voltage for that state is applied to the gate of the cell to program that crystalline state on application of the programming signal.

17. The apparatus of claim 11, wherein each memory cell is connected to a respective access device for controlling access to that cell for programming, and wherein the signal generator is adapted to control access to a memory cell via the access device when applying a programming signal to program the cell.

18. The apparatus of claim 11, wherein s=2.

19. The apparatus of claim 11, wherein s>2.

20. The apparatus of claim 11, wherein zero bias voltage is applied to the gate of the cell for the read measurement.

* * * * *